United States Patent
Jang et al.

(10) Patent No.: US 8,385,120 B2
(45) Date of Patent: Feb. 26, 2013

(54) METHOD OF PROGRAMMING A NONVOLATILE MEMORY DEVICE

(75) Inventors: Joon-Suc Jang, Hwaseong-si (KR);
Ki-Hwan Choi, Seongnam-si (KR);
Duck-Kyun Woo, Anyang-si (KR);
Si-Hwan Kim, Hwaseong-si (KR)

(73) Assignee: Samsung Electronics Co., Ltd., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 210 days.

(21) Appl. No.: 12/910,063

(22) Filed: Oct. 22, 2010

(65) Prior Publication Data

US 2011/0122697 A1    May 26, 2011

(30) Foreign Application Priority Data

Nov. 26, 2009    (KR) .................. 10-2009-0115063

(51) Int. Cl.
*G11C 16/04* (2006.01)
(52) U.S. Cl. .......... 365/185.12; 365/185.19; 365/185.28
(58) Field of Classification Search ............. 365/185.12, 365/185.19, 185.28
See application file for complete search history.

(56) References Cited

U.S. PATENT DOCUMENTS

| | | | |
|---|---|---|---|
| 5,473,563 A | 12/1995 | Suh et al. | |
| 6,353,555 B1 * | 3/2002 | Jeong | 365/185.11 |
| 7,583,540 B2 * | 9/2009 | Park et al. | 365/185.33 |
| 2008/0151633 A1 * | 6/2008 | Park et al. | 365/185.19 |
| 2009/0052243 A1 | 2/2009 | Park et al. | |

FOREIGN PATENT DOCUMENTS

| | | |
|---|---|---|
| JP | 2004-111643 | 4/2004 |
| KR | 10-2008-0027047 A | 3/2006 |
| KR | 10-2009-0019194 A | 2/2009 |

* cited by examiner

*Primary Examiner* — Pho M Luu
*Assistant Examiner* — Thao Bui
(74) *Attorney, Agent, or Firm* — Muir Patent Consulting, PLLC (57) ABSTRACT

A method of programming a nonvolatile memory device is provided. The method includes providing a plurality of memory cells coupled to a wordline, the plurality of memory cells grouped into a plurality of groups, each group including at least two memory cells, such that for each cell of the plurality of memory cells that has memory cells adjacent both sides, the memory cells immediately adjacent either side of the cell belong to different groups from each other. The method further includes selecting one group from the plurality of groups, and performing a program operation including applying a program pulse to the selected group while one or more non-selected groups of the plurality of groups are inhibited from being programmed.

18 Claims, 9 Drawing Sheets

METHOD OF PROGRAMMING A NONVOLATILE MEMORY DEVICE

CROSS-REFERENCE TO RELATED APPLICATION(S)

This application claims priority under 35 USC §119 to Korean Patent Application No. 2009-0115063, filed on Nov. 26, 2009, in the Korean Intellectual Property Office (KIPO), the contents of which are incorporated herein in their entirety by reference.

BACKGROUND

1. Technical Field

Example embodiments relate to nonvolatile memory devices, and more particularly to a method of programming a nonvolatile memory device.

2. Description of the Related Art

In a method of programming a nonvolatile memory device, memory cells are selected according to data to be programmed. For example, in one method, a ground voltage is applied to bitlines coupled to the selected memory cells, and a power supply voltage is applied as a program inhibit voltage to bitlines coupled to non-selected memory cells. The power supply voltage is applied to a string select line, a program voltage is applied to a selected wordline coupled to the memory cells, and a pass voltage is applied to non-selected wordlines. Then channels of the non-selected memory cells are boosted to VCC−Vth (where VCC represents the power supply voltage and Vth represents a threshold voltage of a string select transistor), and string select transistors coupled to the non-selected memory cells are substantially shut off. Accordingly, Fowler-Nordheim (F-N) tunneling does not occur between a floating gate and a channel in each non-selected memory cell, and the non-selected memory cells are not programmed.

However, as integration density increases, a capacitance between channels of adjacent memory cells increases. This increased capacitance may prevent the channels of the non-selected memory cells from being sufficiently boosted. Accordingly, when a memory cell adjacent to a non-selected memory cell is programmed in the same wordline, the non-selected memory cell can be unintentionally programmed, which is referred to as "program disturb". In particular, the program disturb is likely to occur when adjacent memory cells on both sides of the non-selected memory cells are programmed.

SUMMARY

Some example embodiments provide a method of programming a nonvolatile memory device, to reduce program disturb.

In one embodiment, a method of programming a nonvolatile memory device is disclosed. The method includes providing a plurality of memory cells coupled to a wordline, the plurality of memory cells grouped into a plurality of groups, each group including at least two memory cells, such that for each cell of the plurality of memory cells that has memory cells adjacent both sides, the memory cells immediately adjacent either side of the cell belong to different groups from each other. The method further includes selecting one group from the plurality of groups, and performing a program operation including applying a program pulse to the selected group while one or more non-selected groups of the plurality of groups are inhibited from being programmed.

In another embodiment, a method of programming memory cells in a nonvolatile memory device is disclosed. The method comprises receiving a write command to write to a wordline of the nonvolatile memory device. The method additionally comprises performing a first program operation on all of the memory cells of the wordline, the first program operation including applying at least a first program pulse to all of the memory cells of the wordline simultaneously, and subsequent to performing the first program operation and before all of the memory cells are programmed, performing a second program operation. The second program operation includes a first step of applying at least a second program pulse to a first group of the memory cells of the wordline while applying a program inhibit voltage to a second group of the memory cells of the wordline, and a second step of applying at least a third program pulse to the second group of the memory cells of the wordline while applying a program inhibit voltage to the first group of the memory cells of the wordline.

In another embodiment, another method of programming a nonvolatile memory device is disclosed. The method comprises including first memory cells coupled to 4N+1-th bitlines and 4N+2-th bitlines and second memory cells coupled to 4N+3-th bitlines and 4N+4-th bitlines in a first group and a second group, respectively, where N is an integer greater than or equal to 0. The method additionally includes applying a data voltage to each of the 4N+1-th bitlines, the 4N+2-th bitlines, the 4N+3-th bitlines and the 4N+4-th bitlines according to data to be programmed; applying a first program pulse to a wordline coupled to the first memory cells and the second memory cells; and increasing the first program pulse to create a second program pulse. When the second program pulse has a voltage level higher than a predetermined voltage level, the method further includes applying a program inhibit voltage to the 4N+3-th bitlines and the 4N+4-th bitlines, applying a data voltage to each of the 4N+1-th bitlines and the 4N+2-th bitlines according to the data to be programmed, and applying a second program pulse to the wordline. After the second program pulse is applied to the word line, the method includes applying the program inhibit voltage to the 4N+1-th bitlines and the 4N+2-th bitlines, applying a data voltage to each of the 4N+3-th bitlines and the 4N+4-th bitlines according to the data to be programmed, and applying a third program pulse to the wordline, the third program pulse having substantially the same voltage level as the second program pulse.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF THE EMBODIMENTS

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the sizes and relative sizes of circuitry and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the disclosed embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
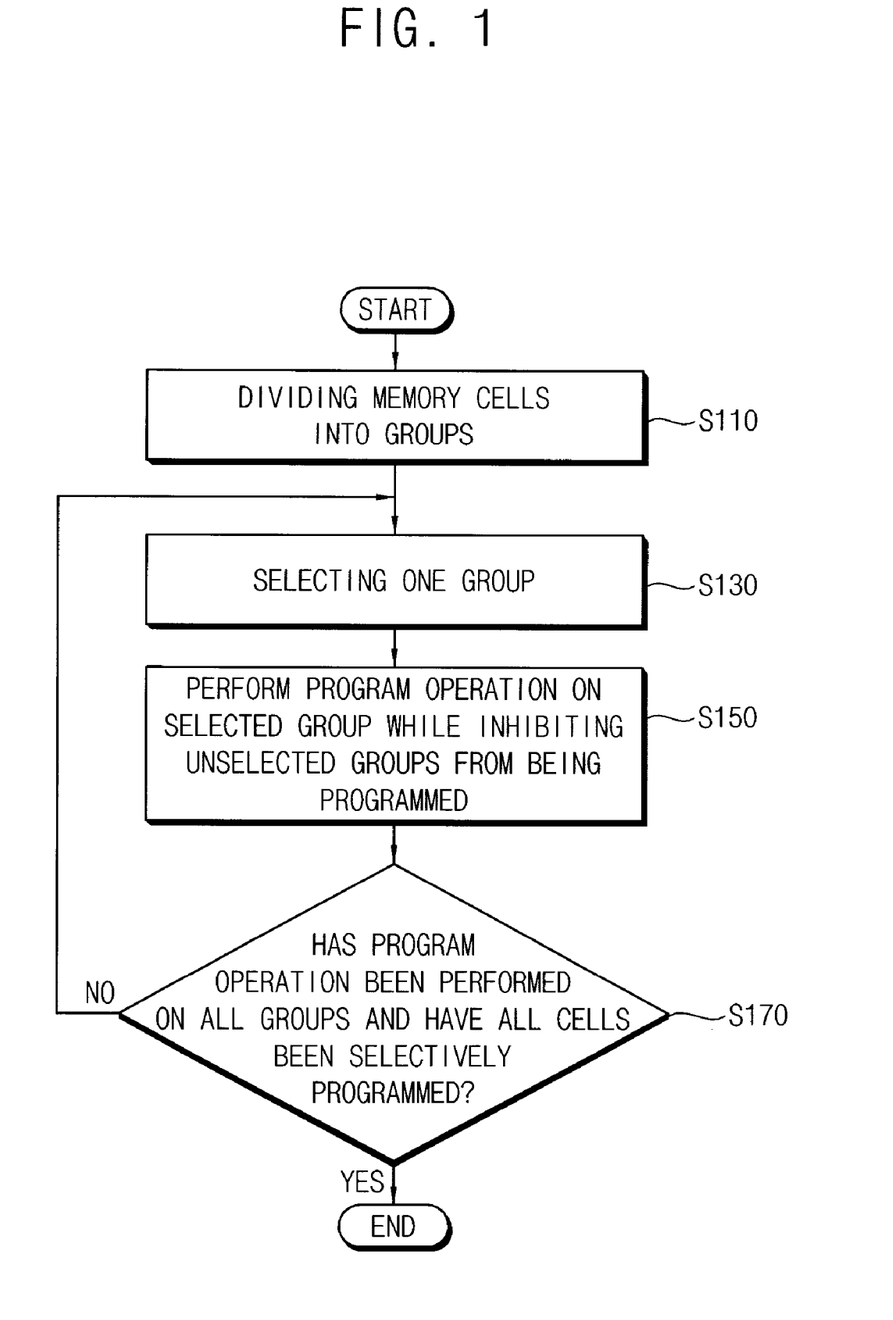
FIG. 1 is a flow chart illustrating a method of programming a nonvolatile memory device according to example embodiments.

FIG. 1 is a flow chart illustrating a method of programming a nonvolatile memory device according to example embodiments.

Programming, as described herein, includes a series of steps. For example, after receiving a write command (which may include address information and data), and a series of additional steps apply voltages across memory cells connected to bitlines and verify that the memory cells were correctly written to. The term "program operation" used herein refers to one or more of the steps used in programming one or more memory cells.

Referring to FIG. 1, a plurality of memory cells coupled to a selected wordline are arranged into a plurality of groups (step S110). In one embodiment, the plurality of memory cells in the selected wordline row are arranged such that the two memory cells immediately adjacent either side of each memory cell (not including the memory cells on the end, which are only adjacent one other memory cell) belong to different groups. For example, first memory cells coupled to 4N+1-th bitlines and 4N+2-th bitlines may be grouped into a first group, and second memory cells coupled to 4N+3-th bitlines and 4N+4-th bitlines may be grouped into a second group, where N is an integer greater than or equal to 0. Other groupings are possible, however. For example, if "1" represents a memory cell from first group, "2" represents a memory cell from a second group, and "3" represents a memory cell from a third group, memory cells can be arranged, among other ways, in the following patterns: (a) 1 1 1 2 2 1 1 1 2 2 . . . ; (b) 1 1 1 2 2 2 1 1 1 2 2 2 . . . ; (c) 1 1 2 2 3 3 1 1 2 2 3 3. Thus, in one embodiment, for at least four out of every six consecutive memory cells (not including the memory cells at the end of a row), the two memory cells adjacent either side of a given memory cell are in a different group.

In one embodiment, after a write command is received, one group is selected from the plurality of groups (step S130). For example, the first group may be selected.

Next, a program operation is performed on the selected group while non-selected groups are inhibited from being programmed (step S150). For example, a power supply voltage (e.g., VCC) may be applied as a program inhibit voltage to bitlines coupled to memory cells belonging to the non-selected groups regardless of data to be programmed, and the power supply voltage or a ground voltage may be selectively applied as a data voltage to bitlines coupled to memory cells belonging to the selected group according to the data to be programmed. Thereafter, a program pulse may be applied to the selected wordline. The program pulse may have a particular voltage level and a particular pulse width. As a result of the program inhibit voltage, channels of the memory cells belonging to the non-selected groups obtain a voltage level of VCC−Vth, where VCC represents the power supply voltage and Vth represents a threshold voltage of a string select transistor. Accordingly, after the program voltage is applied, the memory cells belonging to the non-selected groups may be inhibited from being programmed. Channels of the memory cells belonging to the selected group may be grounded or may be set to VCC−Vth according to the data to be programmed. Memory cells having the grounded channels may be programmed by Fowler-Nordheim (F-N) tunneling. For example, if the first group is selected, the data voltage may be applied to the 4N+1-th bitlines and the 4N+2-th bitlines, the program inhibit voltage may be applied to the 4N+3-th bitlines and the 4N+4-th bitlines. Thereafter, if the program voltage is applied to the selected wordline, the first memory cells may be selectively programmed according to the data, and the second memory cells may be inhibited from being programmed.

If the program operation described above has not been performed on all of the plurality of groups (step S170: NO), another group (e.g., a second group) is selected from the non-selected groups (step S130). The program operation is performed on the selected another group while the plurality of groups other than the selected another group are inhibited from being programmed (step S150). For example, the second group that is not programmed may be selected. If the second group is selected, the program inhibit voltage may be applied to the 4N+1-th bitlines and the 4N+2-th bitlines, the data voltage may be applied to the 4N+3-th bitlines and the 4N+4-th bitlines, and the program voltage applied to the selected wordline. When the program voltage is applied to the selected wordline, the first memory cells may be inhibited from being programmed, and the second memory cells may be selectively programmed according to the data.

If all of the plurality of groups are selected and all of the memory cells on a wordline for those groups are programmed (step S170: YES), the programming method may be finished. In one embodiment, an additional verification step (not shown) may be performed at one or more points during the method shown in FIG. 1. For example, a verification step may occur between steps S150 and S170, and/or a verification step may be performed after step S170 and before programming is complete. Exemplary verification steps are described in greater detail below.

As described above, in the method of programming a nonvolatile memory device according to some example embodiments, the plurality of memory cells are arranged into the plurality of groups such that the adjacent memory cells on opposite sides of each memory cell belong to different groups, and a programming step is performed on the plurality of groups at different times. Accordingly, the programming method according to some example embodiments may prevent the adjacent memory cells on the two sides of each memory cell from being simultaneously programmed, thereby reducing program disturb.

Figure 2:
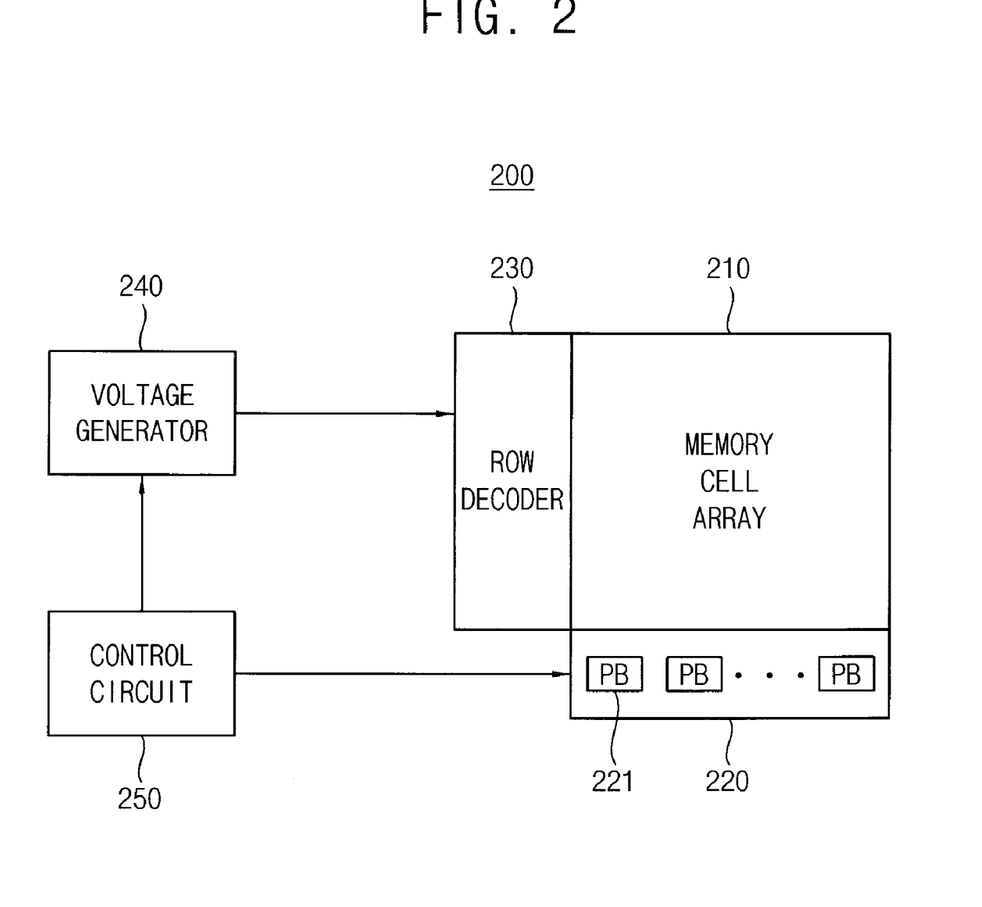
FIG. 2 is a block diagram illustrating a nonvolatile memory device according to example embodiments.

FIG. 2 is a block diagram illustrating a nonvolatile memory device according to example embodiments.

Referring to FIG. 2, a nonvolatile memory device 200 includes a memory cell array 210, a page buffer unit 220, a row decoder 230, a voltage generator 240 and a control circuit 250.

The memory cell array 210 includes memory cells coupled to wordlines and bitlines. The memory cell array 210 may be programmed in units of a page. That is, a program operation may be performed to program all of the memory cells coupled to a selected wordline.

The page buffer unit 220 operates as a write driver or a sense amplifier for the memory cell array 210 based on an operating mode of the nonvolatile memory device 200. For example, the page buffer unit 220 may operate as the sense amplifier in a read mode, and may operate as the write driver in a write mode. The page buffer unit 220 may include a plurality of page buffers 221 respectively coupled to the bitlines. The page buffers 221 may temporarily store data to be programmed in the plurality of memory cells.

The row decoder 230 is configured to select a wordline in response to a row address. The row decoder 230 transfers wordline voltages from the voltage generator 240 to selected and non-selected wordlines. During a program operation, the row decoder 230 may apply a program voltage to the selected wordline and may apply a pass voltage to the non-selected wordlines.

The voltage generator 240 is controlled by control circuit 250 and generates the wordline voltages, such as the program voltage, one or more pass voltages, verify voltage(s), read voltage(s), and so on. In some embodiments, the program voltage may be an incremental step pulse program (ISPP) voltage.

The control circuit 250 controls the page buffer unit 220, the row decoder 230, and the voltage generator 240 to program the data provided from an external controller (not shown) to the memory cell array 210. In one embodiment, the control circuit 250 may control the page buffer unit 220 to apply a program inhibit voltage to bitlines of non-selected groups regardless of the data stored in the page buffers 221.

Hereinafter, an exemplary program operation of the nonvolatile memory device 200 will be described with reference to FIGS. 1 and 2.

The data to be programmed in the plurality of memory cells coupled to the selected wordline are simultaneously loaded in the page buffers 221. The control circuit 250 is configured to control the plurality of memory cells according to a plurality of groups (step S110). For example, the control circuit 250 may separately manage first memory cells coupled to 4N+1-th bitlines and 4N+2-th bitlines and second memory cells coupled to 4N+3-th bitlines and 4N+4-th bitlines, where N is an integer greater than or equal to 0.

The control circuit 250 controls the page buffer unit 220 to select one group from the plurality of groups (step S130). For example, the control circuit 250 may apply a control signal indicating that programming is inhibited to page buffers 221 coupled to bitlines of non-selected groups, and the page buffers 221 coupled to the bitlines of the non-selected groups may apply the program inhibit voltage to the bitlines of the non-selected groups regardless of the loaded data. Page buffers 221 coupled to bitlines of the selected group may apply the data voltage to the bitlines of the selected group according to the load data. For example, bitlines connected to a memory cell to be programmed (e.g. data changed from "1" to "0") may have a ground voltage (e.g., 0 V) applied thereto, and bitlines connected to memory cells whose state should not be changed (e.g., data to remain "1") may have a data voltage applied that prevents the state of the memory cell from changing. The control circuit 250 may control the voltage generator 240 to generate the program voltage and the pass voltage. Note that different program voltages or pass voltages may be used. The row decoder 230 may transfer the program voltage to the selected wordline, and may transfer the pass voltage to non-selected wordlines. Accordingly, the non-selected groups may be inhibited from being programmed, and memory cells on the selected wordline of the selected group may be selectively programmed (step S150).

If the program operation has not been performed on all of the plurality of groups (step S170: NO), the control circuit 250 controls the page buffer unit 220 to select another group from the non-selected groups (step S130). The control circuit 250 may apply the control signal indicating that programming is inhibited to page buffers 221 coupled to bitlines of the plurality of groups other than the selected another group. The page buffer unit 210 may apply the data voltage to bitlines of the selected another group, and may apply the program inhibit voltage to the bitlines of the plurality of groups other than the selected another group. The row decoder 230 may apply the program voltage to the selected wordline, and may apply the pass voltage to the non-selected wordlines. Accordingly, the plurality of groups other than the selected another group may be inhibited from being programmed, and memory cells on the selected wordline of the selected another group may be selectively programmed (step S150). As discussed above, an additional verification step may be included to ensure that all of the memory cells store correct bit values based on the applied data voltages.

Accordingly, the programming method according to some example embodiments may prevent the adjacent memory cells on either side (e.g., on opposite sides) of each memory cell from being simultaneously programmed, thereby reducing program disturb.

Figure 3:
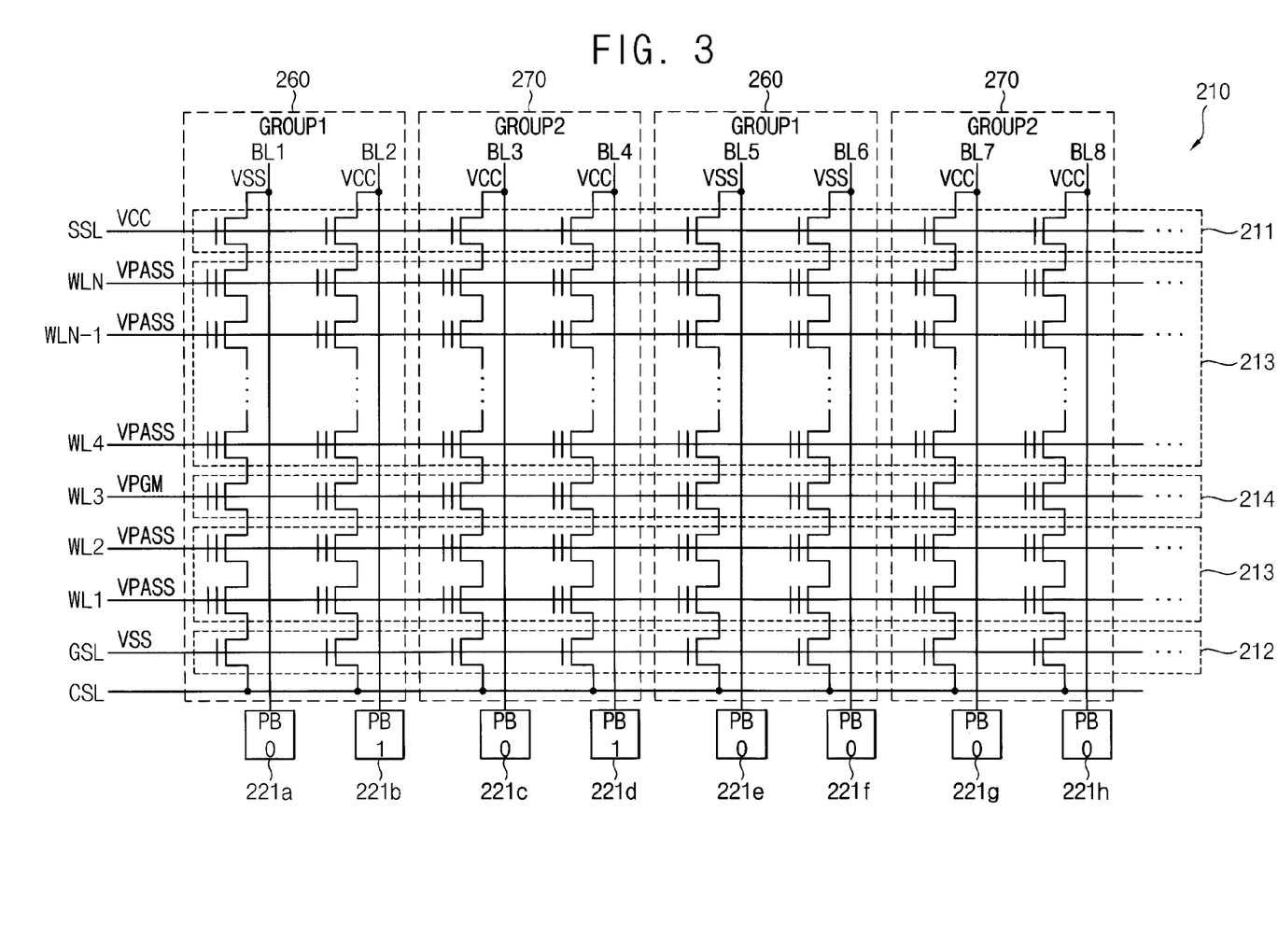
FIG. 3 is a diagram illustrating a memory cell array in which a first group of memory cells is programmed, according to an example embodiment.
Figure 4:
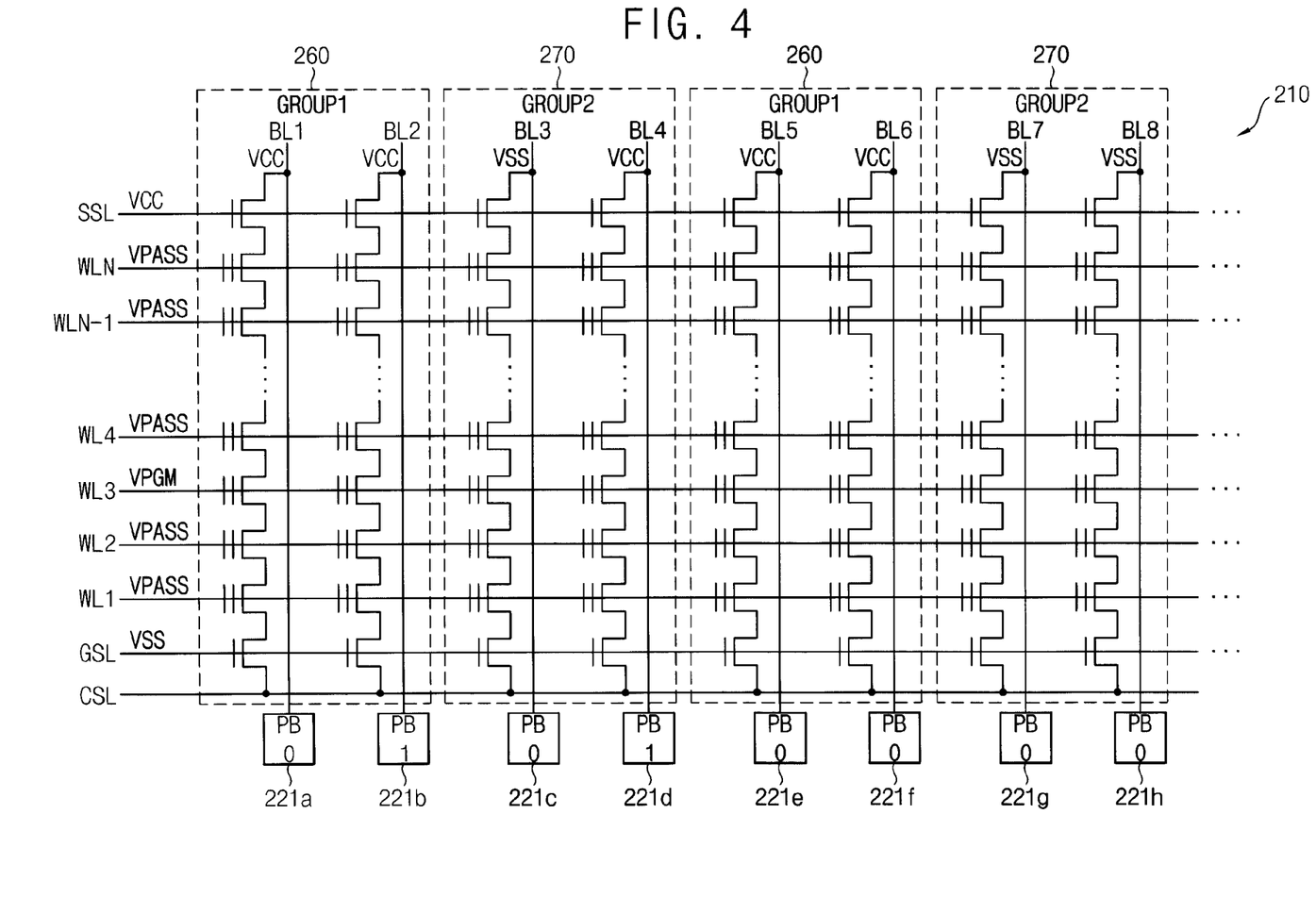
FIG. 4 is a diagram illustrating a memory cell array in which a second group of memory cells is programmed, according to an example embodiment.

FIG. 3 is a diagram illustrating an exemplary memory cell array in which a first group is programmed, and FIG. 4 is a diagram illustrating the memory cell array in which a second group is programmed, according to one embodiment.

Referring to FIG. 3, a memory cell array 210 includes string select transistors 211, ground select transistors 212 and memory cells 213 and 214.

The string select transistors 211 are coupled to bitlines BL1, BL2, BL3, BL4, BL5, BL6, BL7 and BL8, respectively, and the ground select transistors 212 are commonly coupled to a common source line CSL. The memory cells 213 and 214 are coupled in series between the string select transistors 211 and the ground select transistors 212. Control gates of the memory cells 213 and 214 in the same row are commonly coupled to a corresponding wordline WL1, WL2, WL3, WL4, ... WLN-1 and WLN. The string select transistors 211 are controlled by a voltage applied through a string select line SSL, and the ground select transistors 212 are controlled by a voltage applied through a ground select line GSL. The memory cells 213 and 214 are controlled by a voltage applied through the corresponding wordline WL1, WL2, WL3, WL4, ... WLN-1 and WLN. The numbers of cells, bitlines, wordlines, etc., in FIGS. 2 and 3 are exemplary only, and other amounts of these elements could be included in the memory cell array 210.

Hereinafter, an example of a method of programming a nonvolatile memory device with reference to FIGS. 1, 3 and 4 is disclosed. FIGS. 3 and 4 illustrate an example where a third wordline WL3 is selected and a plurality of memory cells 214 coupled to the third wordline WL3 are programmed.

Referring to FIGS. 1 and 3, data to be programmed in the plurality of memory cells 214 coupled to the selected wordline WL3 are loaded in first through eighth page buffers 221a through 221h coupled to first through eighth bitlines BL1 through BL8. First memory cells of the plurality of memory cells 214 coupled to 4N+1-th bitlines BL1 and BL5 and 4N+2-th bitlines BL2 and BL6 are grouped into a first group 260, and second memory cells of the plurality of memory cells 214 coupled to 4N+3-th bitlines BL3 and BL7 and 4N+4-th bitlines BL4 and BL8 are grouped into a second group 270 (step S110).

The first group 260 is selected from the first group 260 and the second group 270 (step S130). The third, fourth, seventh and eighth page buffers 221c, 221d, 221g and 221h apply a power supply voltage VCC as a program inhibit voltage to the third, fourth, seventh and eighth bitlines BL3, BL4, BL7 and BL8 regardless of the data loaded in the third, fourth, seventh and eighth page buffers 221c, 221d, 221g and 221h.

The first, second, fifth and sixth page buffers 221a, 221b, 221e and 221f apply a data voltage to the first, second, fifth and sixth bitlines BL1, BL2, BL5 and BL6 according to the data loaded in the first, second, fifth and sixth page buffers 221a, 221b, 221e and 221f. For example, if the first, second, fifth and sixth page buffers 221a, 221b, 221e and 221f store the data "0", "1", "0", "0", respectively, the first, second, fifth and sixth page buffers 221a, 221b, 221e and 221f may apply a ground voltage VSS, the power supply voltage VCC, the ground voltage VSS and the ground voltage VSS to the first, second, fifth and sixth bitlines BL1, BL2, BL5 and BL6, respectively.

If the power supply voltage VCC is applied to the string select line SSL, a program voltage VPGM is applied to the selected wordline WL3, and a pass voltage VPASS is applied to non-selected wordlines WL1, WL2, WL4, WLN-1 and WLN, then the voltage level of channels of the second memory cells belonging to the second group 270 is set based on the inhibit voltage. Thus, the second memory cells are not programmed The first memory cells belonging to the first group 260 are selectively programmed according to the data voltage applied to the first, second, fifth and sixth bitlines BL1, BL2, BL5 and BL6. For example, the first memory cells coupled to the first, fifth and sixth bitlines BL1, BL5 and BL6 to which the ground voltage VSS is applied may be programmed by the F-N tunneling, while second memory cell connected to bitline BL2 remains in the same state (e.g., the "1" state) based on VCC being applied. In other words, the second memory cell is prevented from changing state, similarly to the memory cells belonging to the second group 270. Accordingly, memory cells of the first group 260 may be selectively programmed based on data, while the second group 270 is inhibited from being programmed (step S150).

Referring to FIGS. 1 and 4, since the second group 270 is not yet programmed (step S170: NO), the second group 270 is selected (step S130). The first, second, fifth and sixth page buffers 221a, 221b, 221e and 221f apply the power supply voltage VCC to the first, second, fifth and sixth bitlines BL1, BL2, BL5 and BL6 regardless of the loaded data, thereby inhibiting programming.

The third, fourth, seventh and eighth page buffers 221c, 221d, 221g and 221h apply the data voltage to the third, fourth, seventh and eighth bitlines BL3, BL4, BL7 and BL8 according to the loaded data. For example, if the third, fourth, seventh and eighth page buffers 221c, 221d, 221g and 221h store the data "0", "1", "0", "0", respectively, the third, fourth, seventh and eighth page buffers 221c, 221d, 221g and 221h may apply the ground voltage VSS, the power supply voltage VCC, the ground voltage VSS and the ground voltage VSS to the third, fourth, seventh and eighth bitlines BL3, BL4, BL7 and BL8, respectively. Note that the data may not necessarily correspond to voltages in the manner described above. That is, the resulting memory cell state representing "0" could be instead considered "1" and a memory cell state representing "1" could instead represent "0."

If the power supply voltage VCC is applied to the string select line SSL, the program voltage VPGM is applied to the selected wordline WL3, and the pass voltage VPASS is applied to non-selected wordlines WL1, WL2, WL4, . . . WLN-1 and WLN, then channels of the first memory cells belonging to the first group 260 are boosted. Thus, the first memory cells are not programmed The second memory cells belonging to the second group 270 are selectively programmed according to the data voltage applied to the third, fourth, seventh and eighth bitlines BL3, BL4, BL7 and BL8. Accordingly, memory cells of the second group 270 may be selectively programmed while the first group 260 is inhibited from being programmed (step S150).

In one embodiment, after all of the memory cells of the first group 260 and the second group 270 are programmed (step S170: YES), if no further groups need to be programmed, the programming method may be finished and is considered completed. In one embodiment, one or more additional verification steps may be carried out, as described further below. The method of programming of a nonvolatile memory device according to some example embodiments prevents adjacent memory cells on either side of each memory cell from being simultaneously programmed. For example, a memory cell coupled to the first bitline BL1 is programmed when the first group 260 is programmed, and a memory cell coupled to the third bitline BL3 is programmed when the second group 270 is programmed. That is, in one embodiment, the memory cells immediately adjacent either side of a memory cell coupled to the second bitline BL2 are programmed at different times.

Accordingly, the likelihood of the memory cell coupled to the second bitline BL2 being unintentionally programmed is reduced.

The exemplary selective programming operations of groups of cells described herein may include structure and operation of programming disclosed in U.S. Pat. No. 5,473,563, issued to Suh et al., and incorporated by reference herein in its entirety. In one embodiment, inhibiting programming of non-selected groups may be accomplished by temporarily modifying, during the inhibiting period, the data output from page buffers onto bit lines to correspond to data "1" (e.g., Vcc).

Figure 5A:
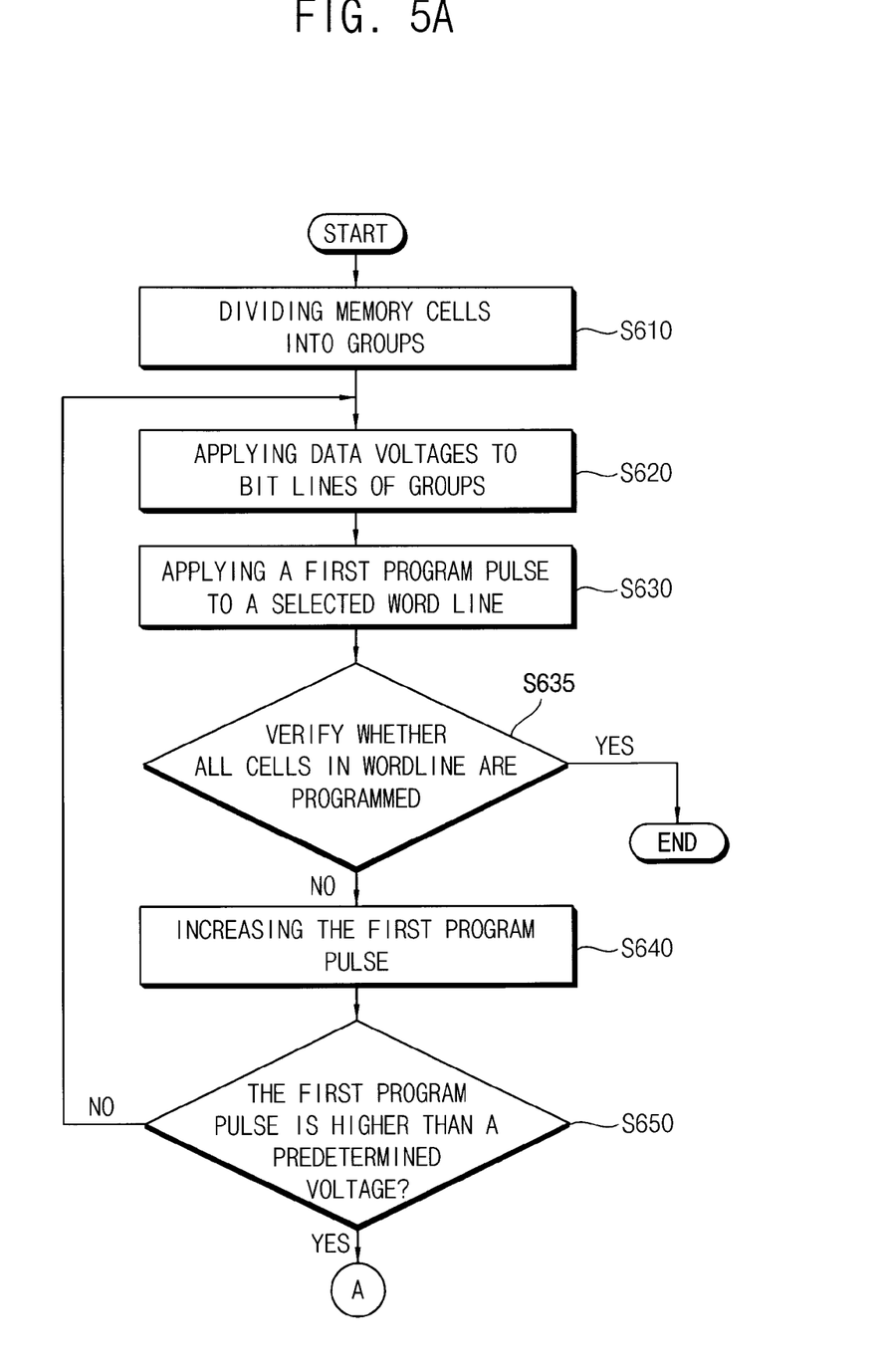
FIGS. 5A and 5B are a flow chart illustrating a method of programming a nonvolatile memory device according to example embodiments.
Figure 5B:
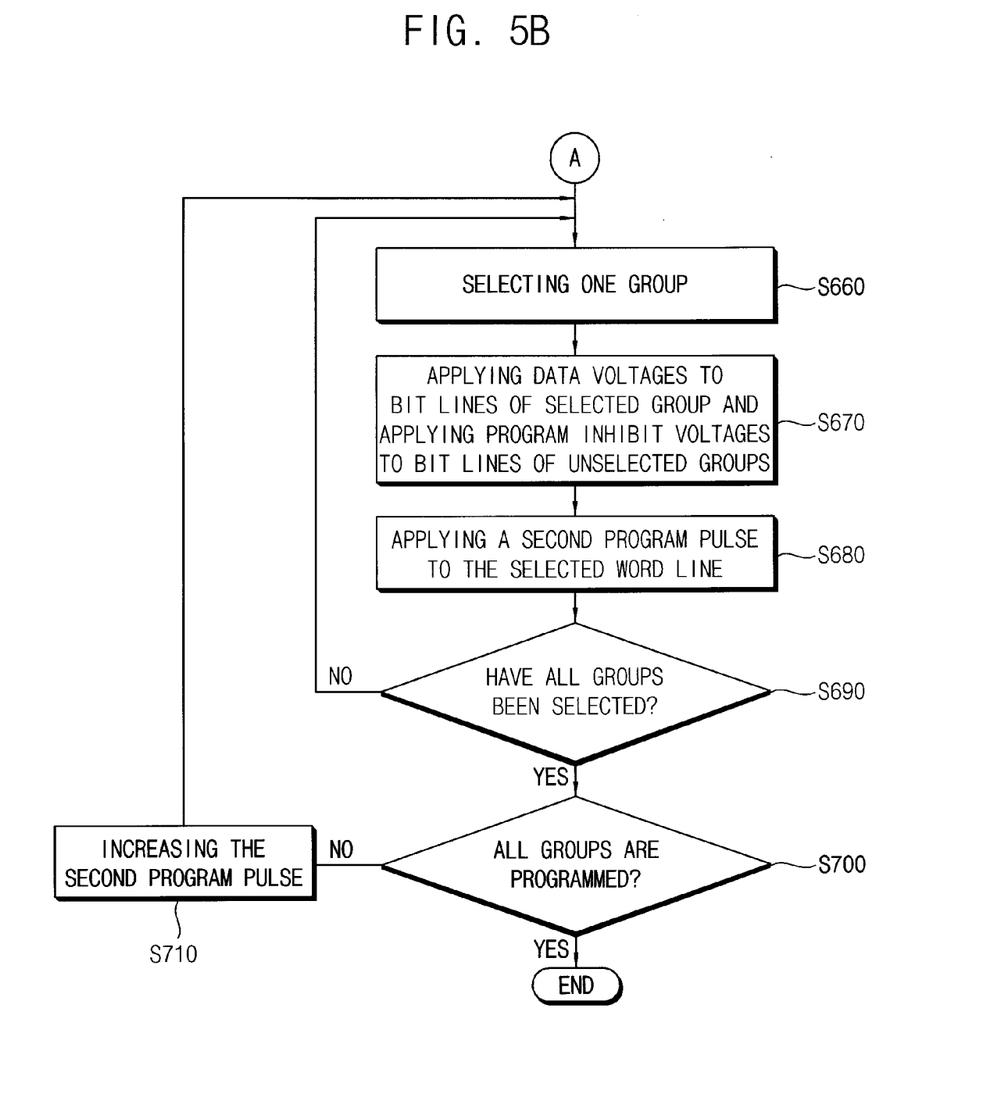

FIGS. 5A and 5B are a flow chart illustrating a method of programming a nonvolatile memory device according to example embodiments.

Referring to FIGS. 3, 4, 5A and 5B, according to the method, a plurality of memory cells 214 coupled to a selected wordline WL3 are arranged into a plurality of groups 260 and 270 (step S610). The plurality of memory cells 214 may be grouped such that the adjacent memory cells on either side of each memory cell belong to different groups. For example, first memory cells coupled to 4N+1-th bitlines BL1 and BL5 and 4N+2-th bitlines BL2 and BL6 may be grouped into a first group 260, and second memory cells coupled to 4N+3-th bitlines BL3 and BL7 and 4N+4-th bitlines BL4 and BL8 may be grouped into a second group 270, where N is an integer greater than or equal to 0.

A data voltage is applied to all of bitlines BL1, BL2, BL3, BL4, BL5, BL6, BL7 and BL8 according to data to be programmed (step S620). For example, if first through eighth page buffers 221a through 221h stores the data "0", "1", "0", "1", "0", "0", "0" and "0", respectively, the first through eighth page buffers 221a through 221h may apply a ground voltage VSS, a power supply voltage VCC, the ground voltage VSS, the power supply voltage VCC, the ground voltage VSS, the ground voltage VSS, the ground voltage VSS and the ground voltage VSS to first through eighth bitlines BL1 through BL8, respectively.

While the data voltage is applied, a first program pulse is applied to the selected wordline WL3 (step S630). In one embodiment, the first program pulse is applied as a program voltage VPGM having a particular voltage level and pulse width to the selected wordline WL3, and a pass voltage VPASS is applied to non-selected wordlines WL1, WL2, WL4, . . . WLN-1 and WLN. Accordingly, some or all of the plurality of memory cells 214 are programmed. In some embodiments, after the first program pulse is applied to the selected wordline WL3, a verify operation may be performed (S635). The verify operation may verify whether all of the plurality of memory cells 214 have been correctly programmed or not. In on embodiment, if a memory cell is verified to be correctly programmed by the verify operation (e.g., the state of the cell corresponds correctly to the voltage applied to its corresponding bitline, data indicating as such (e.g., "0") may be loaded in a page buffer coupled to the verified memory cell. If all of the memory cells in the page are verified correctly corresponding to the applied bitline voltage levels, the programming method ends.

However, if after the verify operation is complete, at least one memory cell of the plurality of memory cells is still not programmed correctly, the first program pulse may be increased (e.g., a voltage level of the first program pulse may be increased, and/or the pulse width of the first program pulse may be increased) (step S640). In one embodiment, it is determined if the increased first program voltage has a voltage level higher than a predetermined voltage (step S650). If the increased first program pulse has the voltage level lower than (or in one embodiment, equal to or lower than) the predetermined voltage (step S650: NO), the data voltage is again applied to the bitlines BL1 through BL8 (step S620). Thereafter, the increased first program pulse is again applied to the selected wordline WL3 (step S630).

The voltage level of the first program pulse may be repeatedly increased and applied, until either all of the memory cells connected to the word line WL3 are verified to be correctly programmed, or until the increased first program pulse has the voltage level higher than (or in one embodiment, equal to or higher than) that of the predetermined voltage, whichever occurs earlier. If all of the memory cells are verified to be correctly programmed, then the method ends. However, if not all of the memory cells are correctly programmed, when the increased first program pulse has the voltage level higher than (or in one embodiment, equal to or higher than) that of the predetermined voltage (step S650: YES), then a grouping procedure may be applied. As shown in FIG. 5B, in one embodiment, one group is selected from the plurality of groups 260 and 270 (step S660).

The predetermined voltage level may be determined based on testing that determines at what voltage disturbance in the memory cells begins. For example, in some embodiments, the predetermined voltage may have a voltage level less than a voltage level inducing channel coupling between adjacent memory cells sufficient to cause the F-N tunneling. In other embodiments, the predetermined voltage may be determined based on a number of cells adjacent a given cell that are not inhibited from being programmed, or based on a number of cells in the row that have been programmed.

After a group is selected, a program inhibit voltage is applied to bitlines coupled to memory cells belonging to non-selected groups, and the data voltage is applied to bitlines coupled to memory cells belonging to the selected group (step S670). For example, if the first group 260 is selected, the third, fourth, seventh and eighth page buffers 221c, 221d, 221g and 221h may apply the power supply voltage VCC as the program inhibit voltage to the third, fourth, seventh and eighth bitlines BL3, BL4, BL7 and BL8, and the first, second, fifth and sixth page buffers 221a, 221b, 221e and 221f may apply the ground voltage VSS, the power supply voltage VCC, the ground voltage VSS and the ground voltage VSS to the first, second, fifth and sixth bitlines BL1, BL2, BL5 and BL6, respectively.

Next, a second program pulse is applied to the selected wordline WL3 (step S680). The second program pulse may be applied as the program voltage VPGM to the selected wordline WL3, and the pass voltage VPASS may be applied to non-selected wordlines WL1, WL2, WL4, . . . WLN-1 and WLN. Accordingly, a program operation may be performed for the memory cells on the selected wordline in the first group 260 while the second group 270 is inhibited from being programmed.

Thereafter, since the second group 270 has not yet been not selected (step S690: NO), the second group 270 is selected (step S660). The program inhibit voltage may be applied to the first, second, fifth and sixth bitlines BL1, BL2, BL5 and BL6, and the data voltage may be applied to the third, fourth, seventh and eighth bitlines BL3, BL4, BL7 and BL8 (step S670).

In one embodiment, at this time, a third program pulse substantially the same as the second program pulse is applied to the selected wordline WL3 (step S680). A voltage level and a width of the third program pulse may be the same as those of the second program pulse. The third program pulse may be applied as the program voltage VPGM to the selected wordline WL3, and the pass voltage VPASS may be applied to non-selected wordlines WL1, WL2, WL4, . . . WLN-1 and WLN. Accordingly, a program operation may be performed on the memory cells on the selected wordline in the second group 270 while the first group 260 is inhibited from being programmed.

Since the program operation has been performed for all of the first group 260 and the second group 270 (step S690: YES), it is verified whether all of the memory cells 214 are correctly programmed (step S700) (e.g., it is verified whether the memory cells include data that correctly reflects the data sent over the bitlines). A verify operation for all of the first group 260 and the second group 270 may be performed.

If an incorrectly programmed or non-programmed memory cell exists (step S700: NO), the second program pulse and the third program pulse are increased (step S710) (e.g., voltage may be increased, or pulse width may be increased). The remaining memory cells of the first group 260 may be further programmed using the increased second program pulse while the second group 270 is inhibited from being programmed (step S660, step S670 and step S680). Further, the remaining memory cells of the second group 270 may be further programmed using the increased third program pulse while the first group 260 is inhibited from being programmed (step S660, step S670 and step S680). After all of the first group 260 and the second group 270 are selected and another program operation has been performed for both, (step S690: YES), the verify operation for the first group 260 and the second group 270 may be performed again (step S700). These steps may be repeated until all of the memory cells 214 in the word line are verified to be correctly programmed.

In one embodiment, if all of the plurality of memory cells 214 are correctly programmed (step S700: YES), the program method is finished, and programming is completed. The program method according to some example embodiments may thus prevent the adjacent memory cells on either side of each memory cell from being simultaneously programmed, thereby reducing program disturb. Further, the program method according to some example embodiments may efficiently reduce the program disturb with the minimum increase of a program time by applying a single program pulse for the plurality of groups until the program pulse becomes higher than the predetermined voltage inducing the F-N tunneling by the channel coupling.

Figure 6A:
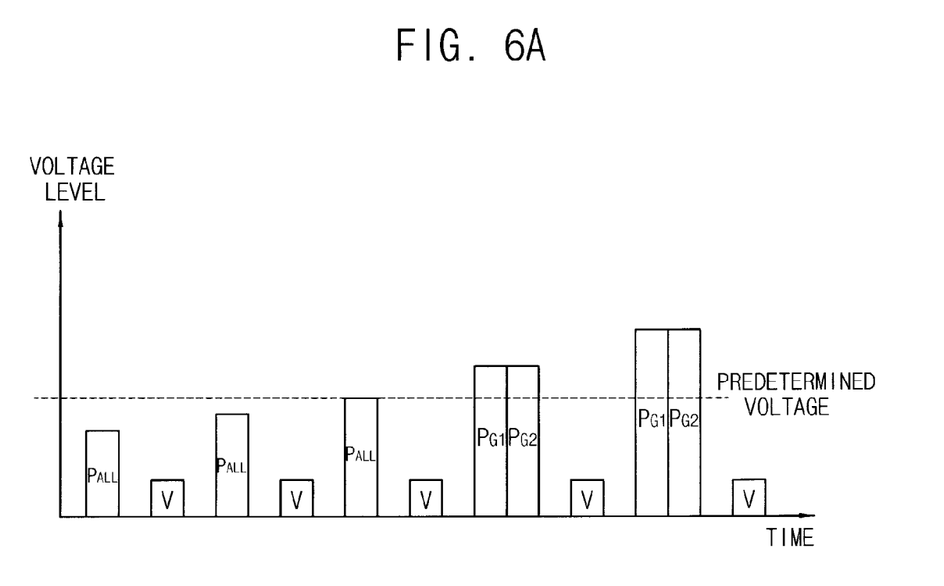
FIG. 6A is a diagram illustrating exemplary voltages applied to a wordline according to the method of FIG. 5.
Figure 6B:
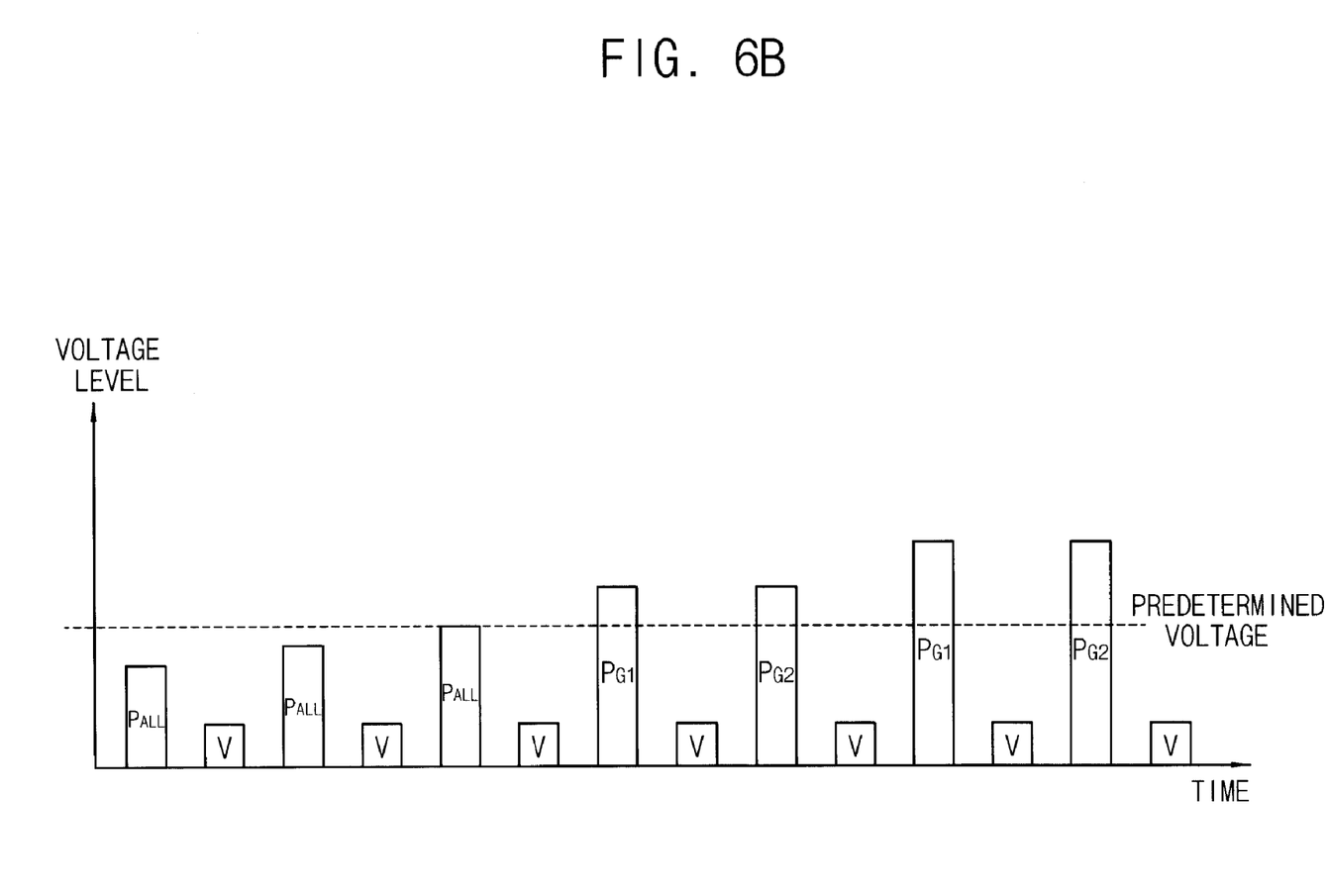
FIG. 6B is a diagram illustrating an exemplary method of applying voltages to a wordline, according to certain embodiments.

FIG. 6A is a diagram illustrating exemplary voltages applied to a wordline according to the method of FIGS. 5A and 5B. FIG. 6B is an alternate embodiment.

Referring to FIG. 6A, if a first program pulse $P_{ALL}$ is lower than a predetermined voltage, a plurality of memory cells belonging to a first group and a second group are simultaneously programmed using the first program pulse $P_{ALL}$. The first program pulse $P_{ALL}$ may be increased step by step. If the first program pulse $P_{ALL}$ becomes higher than the predetermined voltage, memory cells in the first group and the second group are separately programmed using a second program pulse $P_{G1}$ and a third program pulse $P_{G2}$ at different times, respectively. The second program pulse $P_{G1}$ and third program pulse $P_{G2}$ may have the same or substantially the same voltage levels (e.g., levels whose variance, if any, would not significantly change the effects of the applied voltages). Accordingly, adjacent memory cells on either side of each memory cell may not be simultaneously programmed After each program pulse is applied for the first group and the second group, a verify operation may be performed using a verify pulse V.

Other methods may be used to program the memory cells in the different groups. For example, in one embodiment, prior to the program voltage reaching the predetermined voltage, a program operation, such as applying the program voltage, verifying the programming, and increasing the program voltage if not all cells have been programmed, may be applied simultaneously to all of the groups. Then, after the program pulse reaches the predetermined voltage, a program operation may be performed on the different groups in a manner different than that described above. For example, as shown in FIG. 6B, instead of performing a verify step after the second and third program pulses have been applied to the respective groups, a verify step could be performed after the second program pulse has been applied to the first group, and then another verify step could be performed after the third program pulse has been applied to the second group. Each verify step may only require reading of data of the group which has just received a program pulse, and all other cells may remain unread during the verify step. After both verifications, if not all memory cells have been programmed, the program pulse can be increased.

Alternatively, a program operation may be performed by first performing the program voltage/verifying/pulse increase sequence entirely on one group until that group is completely programmed, and then performing the sequence on the second group. Additional verification methods can be seen in U.S. Patent Application Publication No. 2009/0052243, to Park et al., which is incorporated herein by reference in its entirety.

If a plurality of groups are programmed using different program pulses at different times, the number of applications of the program pulses increases, thereby increasing a program time. However, in a program method according to some example embodiments, because a single program pulse is applied for the plurality of groups until the program pulse becomes higher than a predetermined voltage inducing the F-N tunneling by channel coupling, and because the number of verification steps may be decreased, the program method according to some example embodiments may efficiently reduce program disturb with the minimum increase of the program time.

Although certain steps in the embodiments above are described in a particular order, that order need not necessarily be followed in carrying out the method of programming disclosed herein. For example, certain steps could occur simultaneously or in a different order than shown in the figures and described above, without departing from the spirit and scope of the disclosed embodiments. In addition, the embodiments described herein may be implemented in different types of memory, including MLC Flash memory, which is particularly sensitive to disturbances due to tight Vth margins.

Figure 7:
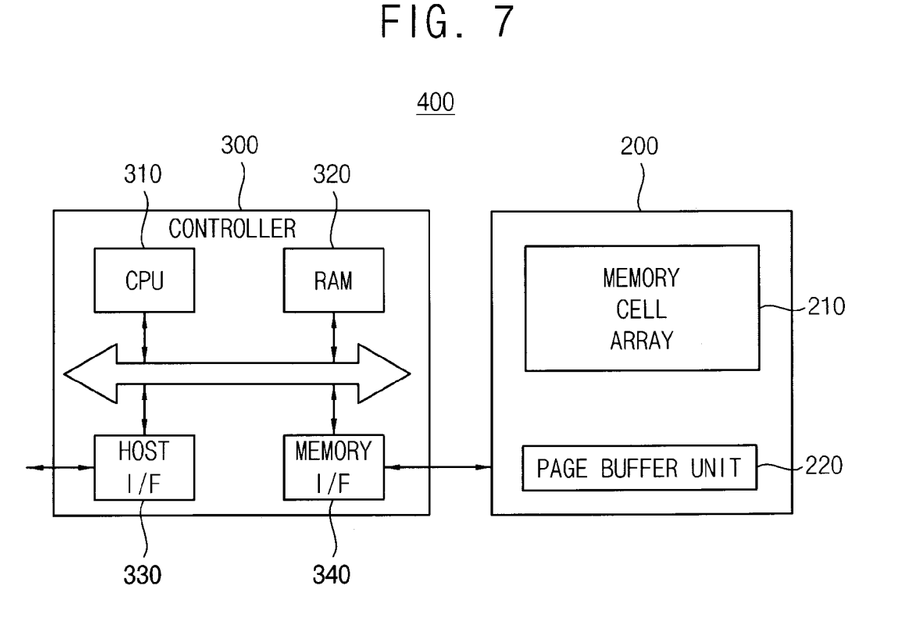
FIG. 7 is a block diagram illustrating a memory system according to example embodiments.

FIG. 7 is a block diagram illustrating a memory system according to example embodiments.

Referring to FIG. 7, a memory system 400 includes a nonvolatile memory device 200 and a controller 300.

The nonvolatile memory device 200 includes a memory cell array 210 and a page buffer unit 220. The memory cell array 210 includes a plurality of memory cells coupled to wordlines and bitlines. In some embodiments, the memory cells may have various cell structures, such as a charge trapping flash structure, a stacked flash structure, a finned flash structure, or a flash structure without source and drain, to name but a few. Data to be programmed in the memory cells are loaded in the page buffer unit 220. In one embodiment, the two immediately adjacent memory cells on either side of each memory cell may be programmed at different times.

The controller 300 controls the nonvolatile memory device 200. The controller 300 controls data transfer between an external host and the nonvolatile memory device 200. The controller 300 may include a central processing unit (CPU) 310, a buffer memory 320, a host interface 330 and a memory interface 340. The CPU 310 may perform the data transfer. The buffer memory 320 may temporarily store data provided from the host or data read from the nonvolatile memory device 200. The controller 300 may load the data provided from the host in the page buffer unit 220 of the nonvolatile memory device 200. The host interface 330 may be coupled to the host, and the memory interface 340 may be coupled to the nonvolatile memory device 200. The CPU 310 may communicate with the host through the host interface 330, and may communicate with the nonvolatile memory device 200 through the memory interface 340.

In some embodiments, the controller 300 may further include an error correction code (ECC) block. The buffer memory 320 may include a dynamic random access memory (DRAM), a static random access memory (SRAM), a phase random access memory (PRAM), a ferroelectric random access memory (FRAM), a resistive random access memory (RRAM), a magnetic random access memory (MRAM), or another form of volatile or nonvolatile memory. The buffer memory 320 may operate as a working memory of the CPU 310.

In some embodiments, the memory system 400 is incorporated into a memory card, a solid state drive (SSD), or other potentially standalone memory product. In various alternative embodiments, the controller 300 may communicate with the host through a universal serial bus (USB) interface, a multi media card (MMC) interface, a peripheral component interconnect express (PCI-E) interface, an advanced technology attachment (ATA) interface, a serial ATA interface, a parallel ATA interface, a small computer system interface (SCSI), an enhanced small device (ESD) interface, an integrated drive electronics (IDE) interface, or the like.

The nonvolatile memory device 200 and/or the controller 300 may be packaged in various forms, such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline IC (SOIC), shrink small outline package (SSOP), thin small outline package (TSOP), system in package (SIP), multi chip package (MCP), wafer-level fabricated package (WFP), or wafer-level processed stack package (WSP).

Figure 8:
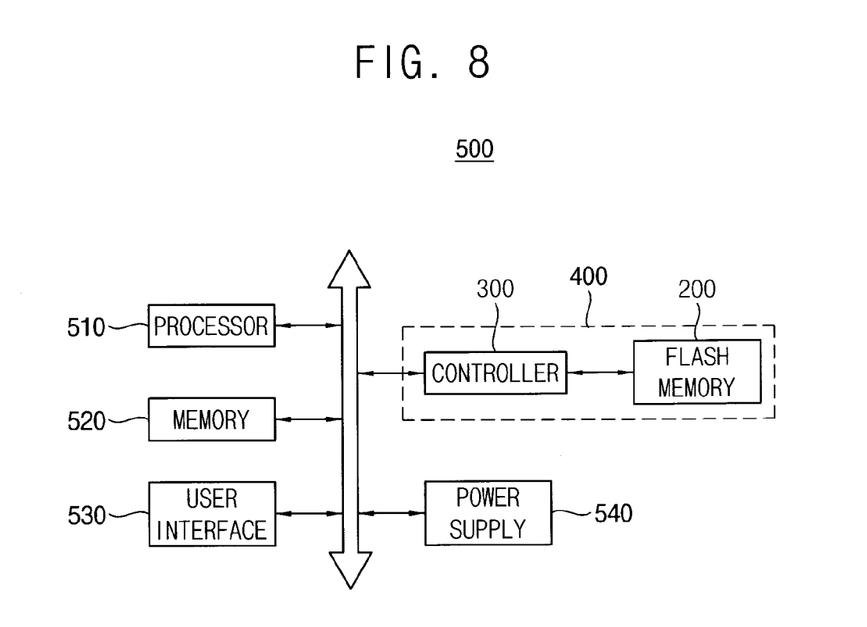
FIG. 8 is a block diagram illustrating a computing device according to example embodiments.

FIG. 8 is a block diagram illustrating a computing device according to example embodiments.

Referring to FIG. 8, a computing system 500 includes a processor 510, a memory device 520, a user interface 530 and a memory system 400.

The processor 510 may perform various computing functions, such as executing specific software for performing specific calculations or tasks. For example, the processor 510 may be a microprocessor or a central process unit (CPU). The processor 510 may be coupled to the memory device 520 via an address bus, a control bus and/or a data bus. For example, the memory device 520 may be a volatile memory such as a DRAM or SRAM, or a non-volatile memory such as an erasable programmable read-only memory (EPROM) or an electrically erasable programmable read-only memory (EEPROM). The processor 510 may be coupled to an expansion bus, such as a peripheral-component-interconnect (PCI) bus. The processor 510 may control the user interface 530 including an input device (e.g., a keyboard or a mouse), an output device (e.g., a printer or a display device) and a storage device (e.g., a hard disk drive or a compact disk read-only memory (CD-ROM)). The computing system 500 may further include a power supply 540 for supplying operational power. The computing system 500 may further include an application chipset, a camera image processor (CIS), and a mobile DRAM.

The computing system 500 can be used to implement any of several different electronic devices, such as a mobile phone, a personal digital assistant (PDA), a digital camera, a gaming machine, a portable multimedia player (PMP), a music player, a desktop computer, a notebook computer, a speaker, a video player, a television, a smart phone, a handheld computer, or a universal serial bus (USB) device, to name but a few.

As mentioned above, a method of programming a nonvolatile memory device according to some example embodiments may prevent adjacent memory cells on either side of each memory cell from being simultaneously programmed, thereby reducing program disturb.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of programming a nonvolatile memory device, the method comprising:
    providing a plurality of memory cells coupled to a wordline, the plurality of memory cells grouped into a plurality of groups, each group including at least two memory cells, such that for each cell of the plurality of memory cells that has memory cells adjacent both sides, the memory cells immediately adjacent either side of the cell belong to different groups from each other,
    wherein first memory cells of the plurality of memory cells are grouped into a first group of the plurality of groups, the first memory cells being coupled to 4N+1-th bitlines and 4N+2-th bitlines, where N is an integer greater than or equal to 0, and
    wherein second memory cells of the plurality of memory cells are grouped into a second group, the second memory cells being coupled to 4N+3-th bitlines and 4N+4-th bitlines;
    and
    performing a program operation including:
    applying a first program pulse to the wordline and applying a data voltage to bitlines coupled to the first group while the second group is inhibited from being programmed; and
    applying a second program pulse to the wordline and applying a data voltage to bitlines coupled to the second group while the first group is inhibited from being programmed.

2. The method of claim 1, wherein performing the program operation is repeatedly performed for different groups until all of the plurality of groups have performed the program operation.

3. The method of claim 1, further comprising:
loading data to be programmed in a plurality of page buffers respectively coupled to the plurality of memory cells.

4. The method of claim 3, wherein the data are simultaneously loaded in the plurality of page buffers.

5. The method of claim 1, wherein performing the program operation further comprises:
applying a program inhibit voltage to the 4N+3-th bitlines and the 4N+4-th bitlines when
applying the data voltage to the 4N+1-th bitlines and the 4N+2-th bitlines according to the data to be programmed.

6. A method of programming memory cells in a nonvolatile memory device, the method comprising:
receiving a write command to write data to memory cells coupled to a wordline of the nonvolatile memory device;
performing a first program operation on all of the memory cells of the wordline, the first program operation including applying at least a first program pulse to all of the memory cells of the wordline simultaneously;
subsequent to performing the first program operation and before all of the memory cells are programmed, performing a second program operation, the second program operation including:
a first step of applying at least a second program pulse to a first group of the memory cells of the wordline while applying a program inhibit voltage to a second group of the memory cells of the wordline, and
a second step of applying at least a third program pulse to the second group of the memory cells of the wordline while applying a program inhibit voltage to the first group of the memory cells of the wordline.

7. The method of claim 6, wherein the second pulse and the third pulse have voltage levels greater than a predetermined voltage level that is lower than a voltage level inducing Fowler-Nordheim tunneling caused by channel coupling between adjacent memory cells of the wordline.

8. The method of claim 6, wherein applying the program inhibit voltage to the second group of memory cells comprises:
applying a power supply voltage to bitlines coupled to the second group of memory cells regardless of data to be programmed to the second group of memory cells.

9. The method of claim 6, wherein the second program operation further comprises:
selectively applying a power supply voltage or a ground voltage to bitlines coupled to memory cells of the first group according to data to be programmed, while applying the at least second program pulse to the wordline and applying the program inhibit voltage to the second group of the memory cells of the wordline; and
selectively applying the power supply voltage or the ground voltage to bitlines coupled to memory cells of the second group according to data to be programmed, while applying the at least third program pulse to the wordline and applying the program inhibit voltage to the first group of the memory cells of the wordline.

10. The method of claim 6, wherein the second program operation further includes:
performing the first step before performing the second step; and
subsequent to performing the second step, performing a verify operation to verify whether all of the first group of memory cells and the second group of memory cells have been correctly programmed.

11. The method of claim 10, wherein the second program operation further includes:
after performing the verify operation, if not all of the first group of memory cells and the second group of memory cells have been programmed, increasing a voltage level of the second program pulse and increasing a voltage level of the third program pulse and then repeating the first step, the second step, and the verify operation for any of the memory cells that have not yet been correctly programmed.

12. The method of claim 6, wherein the third program pulse is substantially the same as the second program pulse.

13. The method of claim 6, further comprising:
applying the second program pulse to the wordline and applying a data voltage to bitlines coupled to the first group of the memory cells of the wordline while applying the program inhibit voltage to the second group of the memory cells of the wordline; and
applying the third program pulse to the wordline and applying a data voltage to bitlines coupled to the second group of the memory cells of the wordline while applying the program inhibit voltage to the first group of the memory cells of the wordline.

14. A method of programming a nonvolatile memory device, comprising:
including first memory cells coupled to 4N+1-th bitlines and 4N+2-th bitlines and second memory cells coupled to 4N+3-th bitlines and 4N+4-th bitlines in a first group and a second group, respectively, where N is an integer greater than or equal to 0;
applying a data voltage to each of the 4N+1-th bitlines, the 4N+2-th bitlines, the 4N+3-th bitlines and the 4N+4-th bitlines according to data to be programmed;
applying a first program pulse to a wordline coupled to the first memory cells and the second memory cells;
increasing the first program pulse to create a second program pulse;
when the second program pulse has a voltage level higher than a predetermined voltage level:
applying a program inhibit voltage to the 4N+3-th bitlines and the 4N+4-th bitlines;
applying a data voltage to each of the 4N+1-th bitlines and the 4N+2-th bitlines according to the data to be programmed;
applying the second program pulse to the wordline; and
after the second program pulse is applied to the word line:
applying the program inhibit voltage to the 4N+1-th bitlines and the 4N+2-th bitlines;
applying a data voltage to each of the 4N+3-th bitlines and the 4N+4-th bitlines according to the data to be programmed; and
applying a third program pulse to the wordline, the third program pulse having substantially the same voltage level as the second program pulse.

15. The method of claim 14, wherein the data are simultaneously loaded in a plurality of page buffers coupled to the first memory cells and the second memory cells.

16. The method of claim 14, wherein the data voltage is determined as a power supply voltage or a ground voltage according to the data to be programmed, and wherein the program inhibit voltage is a ground voltage.

17. The method of claim 14, further comprising:
after the third program pulse is applied to the wordline, verifying whether the first memory cells and the second memory cells are correctly programmed.

18. The method of claim 14, further comprising:
increasing the second program pulse and the third program pulse; and
repeatedly applying the second program pulse and the third program pulse to the wordline until the first memory cells and the second memory cells are programmed.

* * * * *